(12) United States Patent
Lee (10) Patent No.: US 7,519,872 B2
(45) Date of Patent: Apr. 14, 2009

(54) DEINTERLEAVING DEVICE FOR DIGITAL BROADCAST RECEIVERS HAVING A DOWNSIZED DEINTERLEAVER MEMORY AND DEINTERLEAVING METHOD THEREOF

(75) Inventor: Jeong-taek Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 700 days.

(21) Appl. No.: 10/971,163

(22) Filed: Oct. 25, 2004

(65) Prior Publication Data

US 2005/0154963 A1    Jul. 14, 2005

(30) Foreign Application Priority Data

Dec. 30, 2003    (KR) ...................... 10-2003-0099742

(51) Int. Cl.
 *G06F 11/00* (2006.01)
(52) U.S. Cl. ..................................... 714/701
(58) Field of Classification Search ................ 714/701, 714/786, 702, 780; 711/5, 157, 127
See application file for complete search history.

(56) References Cited

U.S. PATENT DOCUMENTS

| | | | | |
|---|---|---|---|---|
| 5,430,767 A | * | 7/1995 | Min | 375/340 |
| 6,035,427 A | * | 3/2000 | Kweon | 714/702 |
| 6,381,728 B1 | * | 4/2002 | Kang | 714/781 |
| 6,434,203 B1 | * | 8/2002 | Halter | 375/341 |
| 6,493,815 B1 | * | 12/2002 | Kim et al. | 711/217 |

* cited by examiner

*Primary Examiner*—Phung M Chung
(74) *Attorney, Agent, or Firm*—Sughrue Mion, PLLC

(57) ABSTRACT

Disclosed is a deinterleaving device and method for digital broadcast receivers having a downsized deinterleaver memory. The deinterleaving device includes a memory having storage space for performing the deinterleaving in a number of deinterleaving units over the K groups of input data in correspondence with an interleaving unit at a transmitter; an address generator for reading data written in the memory and generating memory addresses for writing input data; read-enable unit and write-enable unit for reading and writing data written at the generated memory addresses; and a controller for controlling the address generator to generate the memory addresses for the input data in correspondence with the deinterleaving units, the controller controlling the read-enable unit and the write-enable unit to read data written at the memory addresses before writing the input data at the memory addresses.

16 Claims, 8 Drawing Sheets

| $b(i_r/16)$ | $a(r, i_r)$ |
|---|---|
| 0 | 0 |
| 1 | r−8 |
| 2 | r−4 |
| 3 | r−12 |
| 4 | r−2 |
| 5 | r−10 |
| 6 | r−6 |
| 7 | r−14 |
| 8 | r−1 |
| 9 | r−9 |
| 10 | r−5 |
| 11 | r−13 |
| 12 | r−3 |
| 13 | r−11 |
| 14 | r−7 |
| 15 | r−15 |

DEINTERLEAVING DEVICE FOR DIGITAL BROADCAST RECEIVERS HAVING A DOWNSIZED DEINTERLEAVER MEMORY AND DEINTERLEAVING METHOD THEREOF

CROSS-REFERENCE TO RELATED APPLICATIONS

This application claims the benefit of Korean Patent Application No. 2003-99742 filed Dec. 30, 2003, in the Korean Intellectual Property Office, the disclosure of which is incorporated herein by reference.

BACKGROUND OF THE INVENTION

1. Field of the Invention

The present invention relates to a digital broadcast receiver, and more particularly to a deinterleaving device for digital broadcast receivers having a downsized deinterleaver memory and a deinterleaving method thereof.

2. Description of the Related Art

The European digital audio broadcasting (DAB) receiver compliant with ETSI EN 300 400 has a deinterleaver and a Viterbi decoder as inner decoders. The inner decoders input a DQPSK signal decoded with the 4-bit soft decision, so one data piece of information consists of 4 bits. In the ETSI EN 300 401, time deinterleaving is introduced to be distinguished from frequency deinterleaving.

The European DAB receiver performs the time deinterleaving over 16 Common Interleaved Frames (CIFs). The deinterleaver memory of about 4 Mbits in size is necessary for the deinterleaving. That is, one CIF consists of 55296 symbols, and one symbol denotes 4-bit data decoded with the soft decision. Since 16×55296×4 bits≈4 Mbits, the deinterleaver memory of about 4 Mbits in size is necessary to perform the deinterleaving over 16 CIFs.

Figure 1:
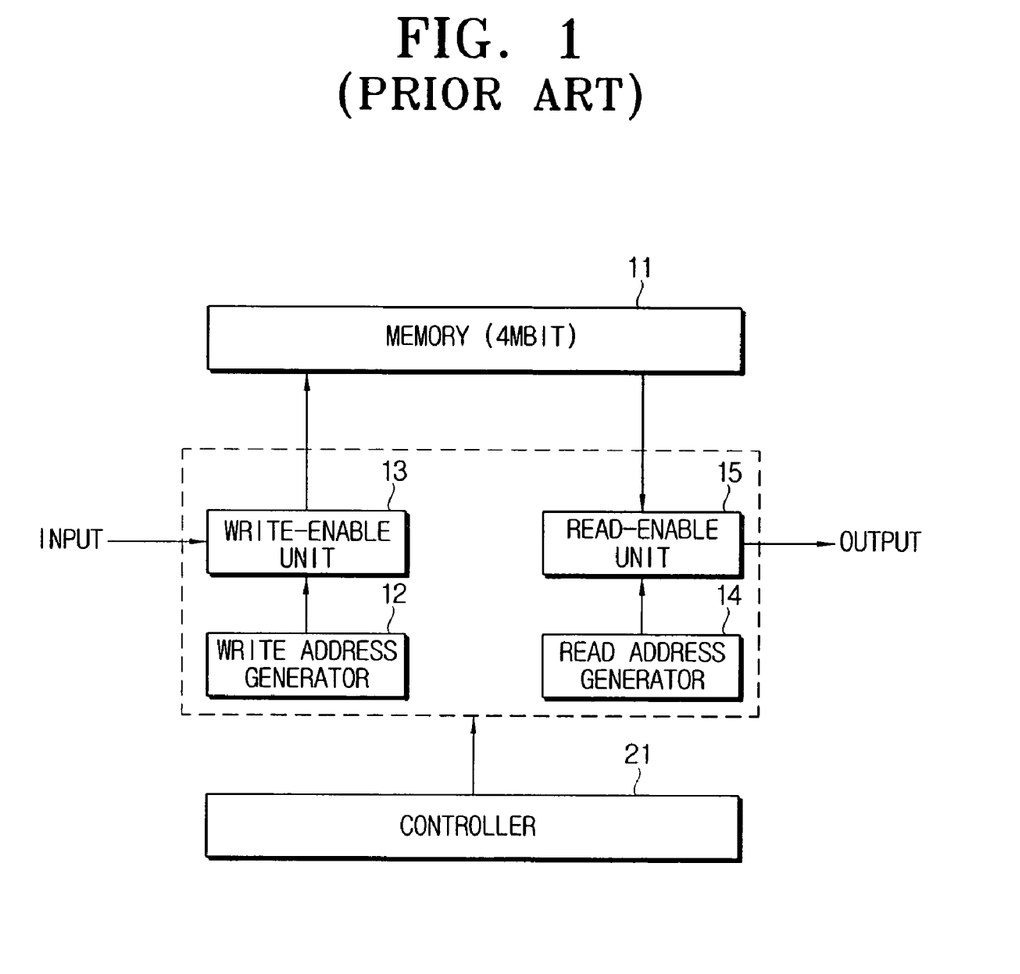
FIG. 1 is a block diagram for showing a deinterleaving device for a conventional European DAB receiver.

FIG. 1 is a block diagram for schematically showing a deinterleaver for a conventional European DAB receiver. The deinterleaver has a memory 11, a write address generator 12, a write-enabling unit 13, a read address generator 14, a read-enabling unit 15, and a controller 21.

The memory 11 has 4 Mbit in size for performing deinterleaving over the 16 CIFs. The write address generator 12 generates write addresses corresponding to soft decision-decoded data symbols inputted according to the controls of the controller 21, the write-enabling unit 13 writes the data symbols inputted at the write addresses. On the other hand, the read address generator 14 generates read addresses according to a predetermined deinterleaving equation with respect to the 16 CIFs stored in the memory 11. Further, the read-enabling unit 15 reads the data symbols written in the read addresses and performs the deinterleaving over the read data symbols.

As above, the conventional deinterleaver memory address structure is as follows:

| CIF address (4 bits) | DATA address (15 bits) |
|---|---|

That is, the deinterleaver memory address consists of a 4-bit CIF address and a 15-bit data address. One CIF independently operates, allowing easy data movement in the deinterleaving, but, in general, the data consisting of one CIF does not take up all the 15 bit places, which causes memory waste. Such an inefficiently large memory size has a disadvantage in terms of power consumption.

One of the methods reducing memory waste as above is to downsize a memory in one fourth by forcibly performing the hard decision decoding over a 4-bit hard-decision signal. Such a method does not affect the performance of the channel decoder under a good channel environment, but leads to a reduction of 2 dB in information symbols due to a hard-decision signal under a poor channel environment. When the signal-to-noise ratio is small, the performance of the channel decoder is deteriorated by that much.

SUMMARY OF THE INVENTION

The present invention has been developed in order to solve the above drawbacks and other problems associated with the conventional arrangement. An aspect of the present invention is to provide a deinterleaving device and method for digital broadcast receivers having a downsized deinterleaver memory.

The forgoing and other objects and advantages are substantially realized by providing a deinterleaving device for digital broadcast receivers for performing deinterleaving over K groups of input data wherein K is an integer, comprising a memory having storage space for performing the deinterleaving in the certain number of deinterleaving units over the K groups of input data in correspondence with an interleaving unit at a transmitter; an address generator for reading data written in the memory and generating memory addresses for writing input data; a read-enable unit for reading data written at the generated memory addresses; a write-enable unit for writing the input data at the generated memory addresses; and a controller for controlling the address generator to generate the memory addresses for the input data in correspondence with the deinterleaving unit, the controller controlling the read-enable unit and the write-enable unit to read data written at the memory addresses before writing the input data at the memory addresses.

The data consist of pairs of first data and second data.

The deinterleaving device further comprises a buffer for temporarily storing specific data of the data read from the read-enable unit, wherein the controller controls the buffer to first output data except for the specific data of the read data and then output the specific data temporarily stored in the buffer.

The deinterleaving unit is the unit over which the deinterleaving is performed by a convolutional deinterleaver having branches and K registers at maximum for each branch, memory space capable of storing K (K+1)/2 for the deinterleaving is needed, and the memory has the memory space corresponding to the certain number of deinterleaving units.

The memory addresses each consist of a branch start address and a register address in the deinterleaving unit, and, corresponding to the certain number of deinterleaving units, K input data in a second deinterleaving unit are written at memory addresses resulting from adding K (K+1)/2 to each of the memory addresses at which K input data in a first deinterleaving unit are written.

The K is 16, each of the groups is a Common Interleaved Frame (CIF), and the CIF consists of 55296 data decoded with 4-bit soft decision, and the certain number of deinterleaving units is 1728 deinterleaving units based on data inputted in pairs.

Another aspect of the present invention is to provide a deinterleaving method for digital broadcast receivers for performing deinterleaving over K groups of input data wherein K is an integer, comprising steps of (a) generating memory addresses for writing input data in a memory having storage space for performing the deinterleaving in the certain number of deinterleaving units over the K groups of the input data in correspondence with an interleaving unit at a transmitter; (b) reading data written at the generated memory addresses; and (c) writing the input data at the generated memory addresses.

The step (b) includes steps of temporarily storing specific data of the data read from the memory; and outputting the specific data after outputting data except for the specific data of the read data.

Accordingly, the deinterleaving device according to the present invention can downsize the deinterleaver memory in half compared to the existing memory size, and have the same performance as the existing deinterleaving device.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE ILLUSTRATIVE, NON-LIMITING EMBODIMENTS

Certain embodiments of the present invention will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, wellknown functions or constructions are not described in detail since they would obscure the invention in unnecessary detail.

Figure 2A:
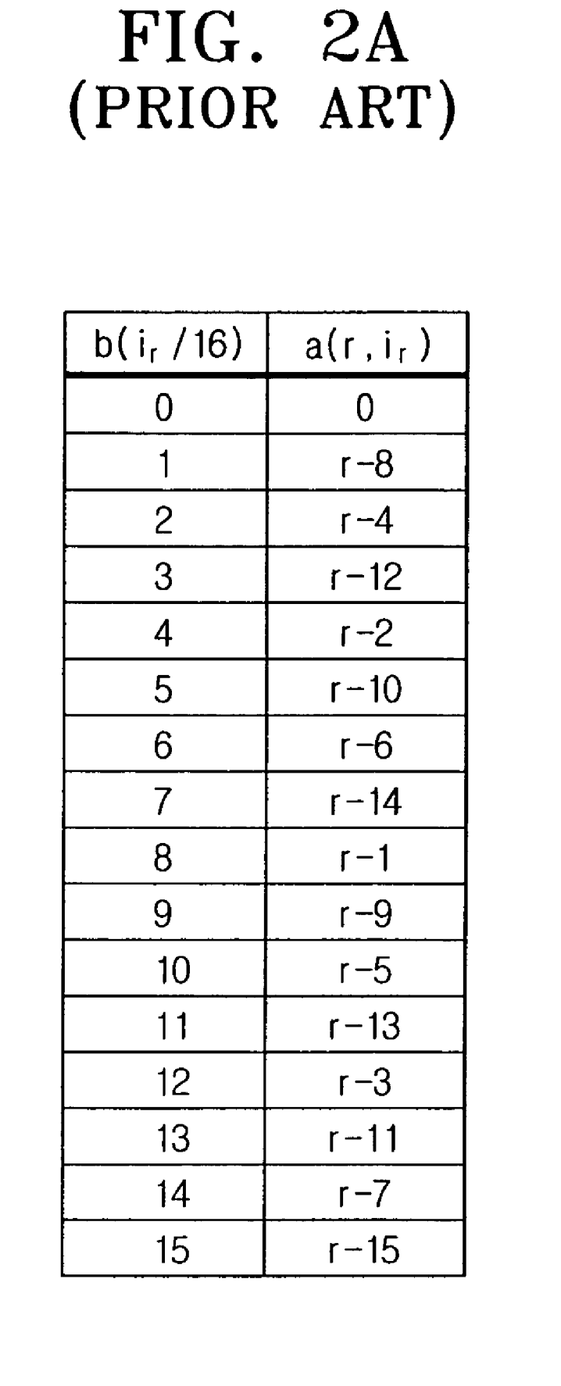
FIG. 2A and FIG. 2B are views for explaining the convolutional interleaving performed in the European DAB receiver.
Figure 2B:
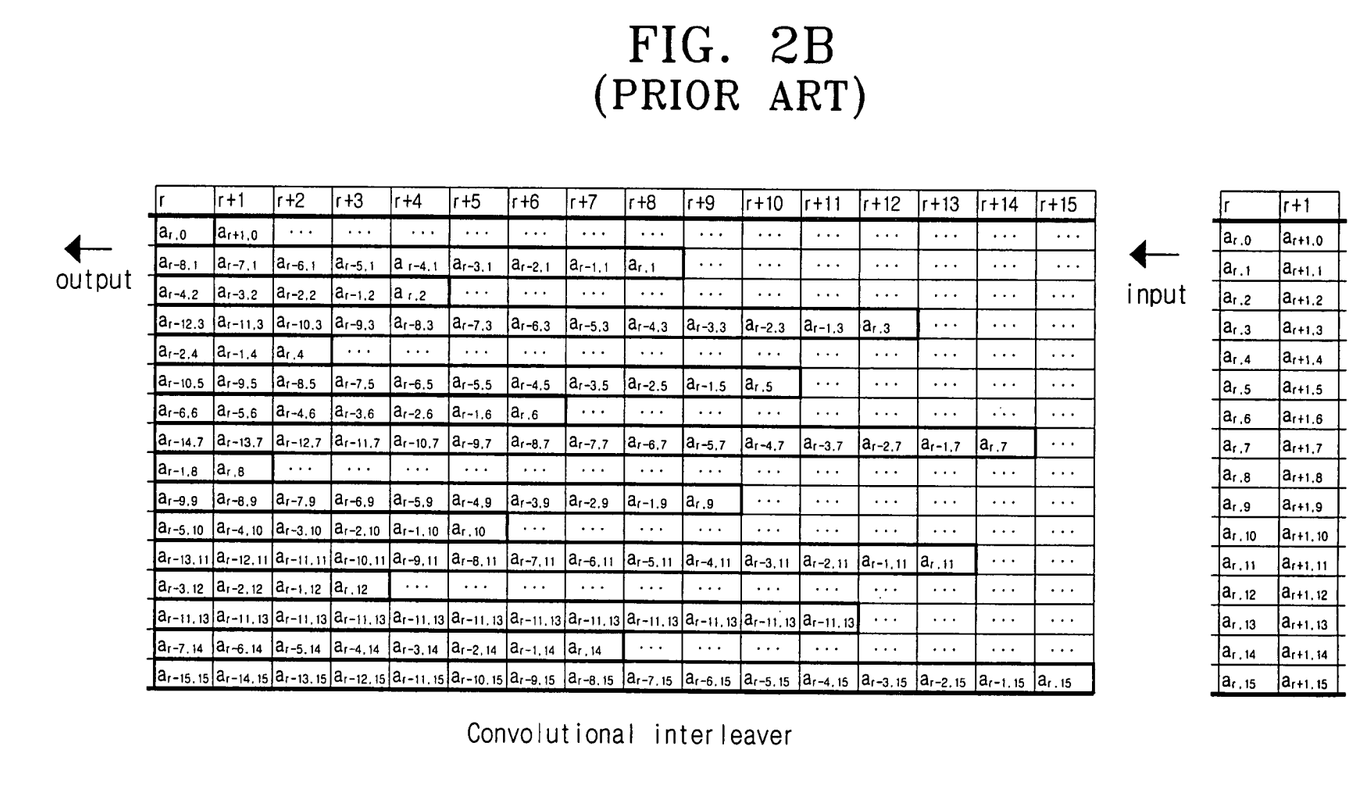

FIG. 2A and FIG. 2B are views for explaining the convolutional interleaving performed in the European DAB receiver. Referring to FIG. 2A, B $(i_r/16)$ denotes a time sequence in the unit of 16 symbols ($i_r$ denotes a sum of modulo-16, that is, a branch number), and r denotes a CIF to be interleaved at a current time. For example, in the sequence b (1) for the modulo-16, CIF data that is 8 CIF data ahead of a current CIF are used for the interleaving. FIG. 2B is a view for explaining the convolutional interleaving in more detail.

As shown in FIG. 2B, the interleaving is performed by a nonlinear convolutional interleaver structured with 16 branches and 136 shift registers.

Symbols $a_{r,0}, a_{r,1}, a_{r,2}, a_{r,3} \ldots, a_{r,15}$ are inputted in 16 branches at time r, and, at the same time, symbols $a_{r,0}, a_{r-8,1}, a_{r-4,2}, a_{r-12,3} \ldots, a_{r-15,15}$ are outputted from the 16 branches at time r. That is, a branch b0 outputs the symbols of a CIF inputted at the present time r, and branch b1 outputs the symbols of a CIF that is nine CIFs ahead of the CIF at the present time r. In the same manner, a branch b15 outputs the symbols of a CIF that is 16 CIFs ahead of the CIF at the present time r, so the convolution interleaving is performed over the 16 CIFs.

As stated above, the transmitter performs the convolutional interleaving over every modulo-16.

Figure 3:
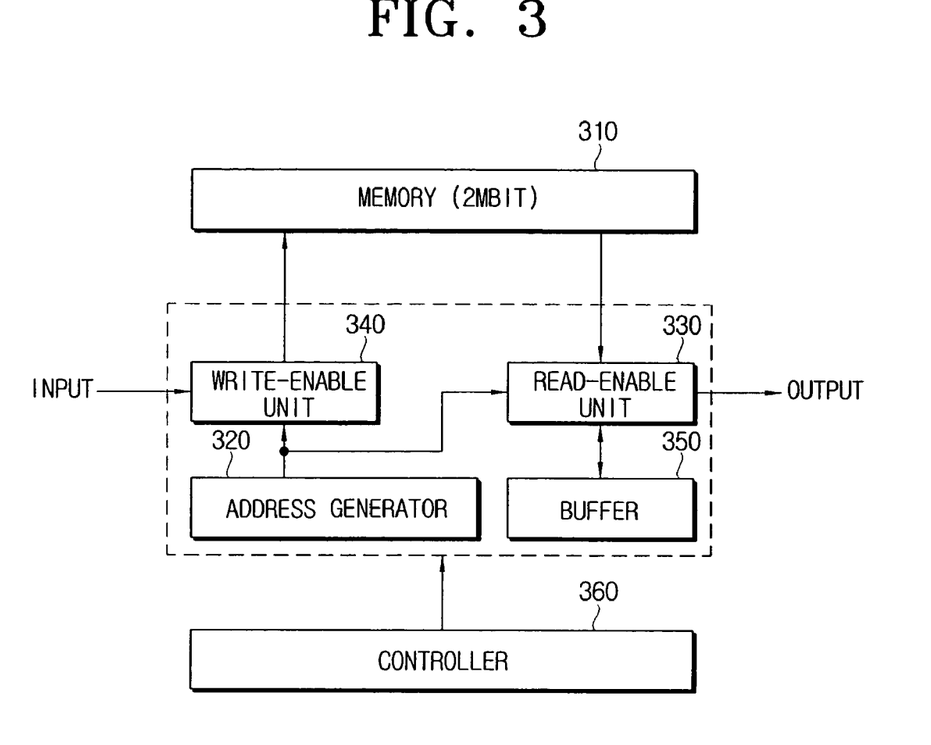
FIG. 3 is a block diagram for showing a deinterleaving device for a European DAB receiver according to an embodiment of the present invention.

FIG. 3 is a schematic block diagram for showing a deinterleaving device for European DAB receivers as an example of a deinterleaving device for digital broadcast receivers according to an embodiment of the present invention.

The deinterleaving device has a memory 310, an address generator 320, a read-enable unit 330, a write-enable unit 340, a buffer 350, and a controller 360.

The memory 310 has a structure consisting of plural convolutional deinterleavers corresponding to the convolutional interleaver structure (refer to FIG. 2B) of a transmitter. That is, in order to perform the convolutional deinterleaving, 3456 convolutional deinterleavers in the modulo-16 unit are used since 1CIF/16=55296/16=3456. 136 registers are used for one convolutional deinterleaver, so that a memory space capable of storing 136 data is provided.

Accordingly, the memory has its size of about 2 Mbit for the convolutional deinterleaving over received 16 CIFs since 136×3456×4 bits=1888064 bits (for soft decision level).

Figure 4:
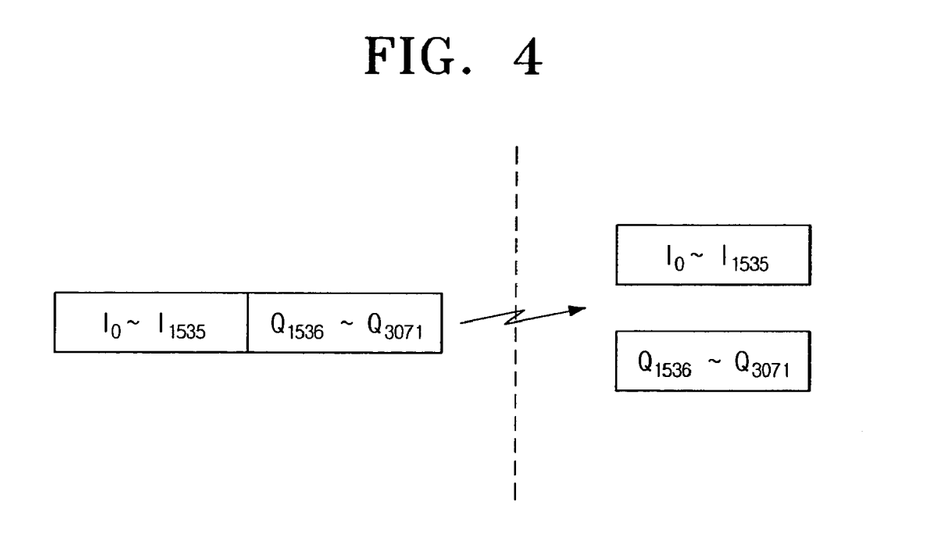
FIG. 4 is a view for showing the arrangement of I data and Q data in the European DAB receiver.

For reference, as shown in FIG. 4, a transmitter transmits 3072 OFMD-modulated OFDM symbols as I symbols ($I_0$ to $I_{1535}$) and Q symbols ($Q_{1536}$ to $Q_{3071}$), and a receiver receives the I symbols ($I_0$ to $I_{1535}$) and the Q symbols ($Q_{1536}$ to $Q_{3071}$) in pairs. That is, the symbols are received and processed in the order of ($I_0, Q_{1536}$), ($I_1, Q_{1537}$), ($I_2, Q_{1538}$), . . . , ($I_{1535}, Q_{3071}$). Therefore, the received signal is decoded with 4-bit soft decision, so that the input data, that is, (I,Q) pairs are each formed in a 8-bit level.

Further, the memory generally has a 8-bit size in width, so one (I,Q) pair, that is, 8-bit data is written at one memory address. Thus, the memory 310 has its size of about 2 Mbits in a width of 8 bits, a depth of 136×1728 in order for the 16 CIFs to be stored. The structure of the memory 310 according to the present invention will be described in detail with reference to FIG. 5 and FIGS. 6A and 6B.

The address generator 320 generates one memory address according to the structural characteristics of the memory 310 of convolutional deinterleaver structure, and the memory address can be a read address and a write address.

The read-enable unit 330 reads data, that is, (I,Q) pair data corresponding to memory addresses generated from the address generator 320.

The write-enable unit 340 writes data, that is, (I,Q) pair data written at the memory addresses generated from the address generator 320. That is, the controller 360 controls the read-enable unit 330 and the write-enable unit 340 to read the data written at the memory addresses generated from the address generator 320 and write input data at the memory addresses.

The buffer 350 temporarily stores and outputs the data read from the read-enable unit 330, that is, Q data out of (I,Q) pair data. This is because, after deinterleaving in the receiver, the Viterbi decoder first processes I data with respect to one OFDM symbol, and then outputs deinterleaved data in the order of I data and Q data according to the characteristics of Q data processing operations.

If the I data of the (I,Q) pair data read from the memory 310 are completely outputted, the controller 360 outputs Q data stored in the buffer 350. Therefore, the buffer 350 has a memory size of 1354×4 bits, that is, of 768×8 bits in a width of 8 bits and a depth of 768.

Hereinafter, the structure of the downsized deinterleaver memory 310 according to the present invention will be described in detail with reference to FIG. 5 and FIGS. 6A and 6B.

Figure 5:
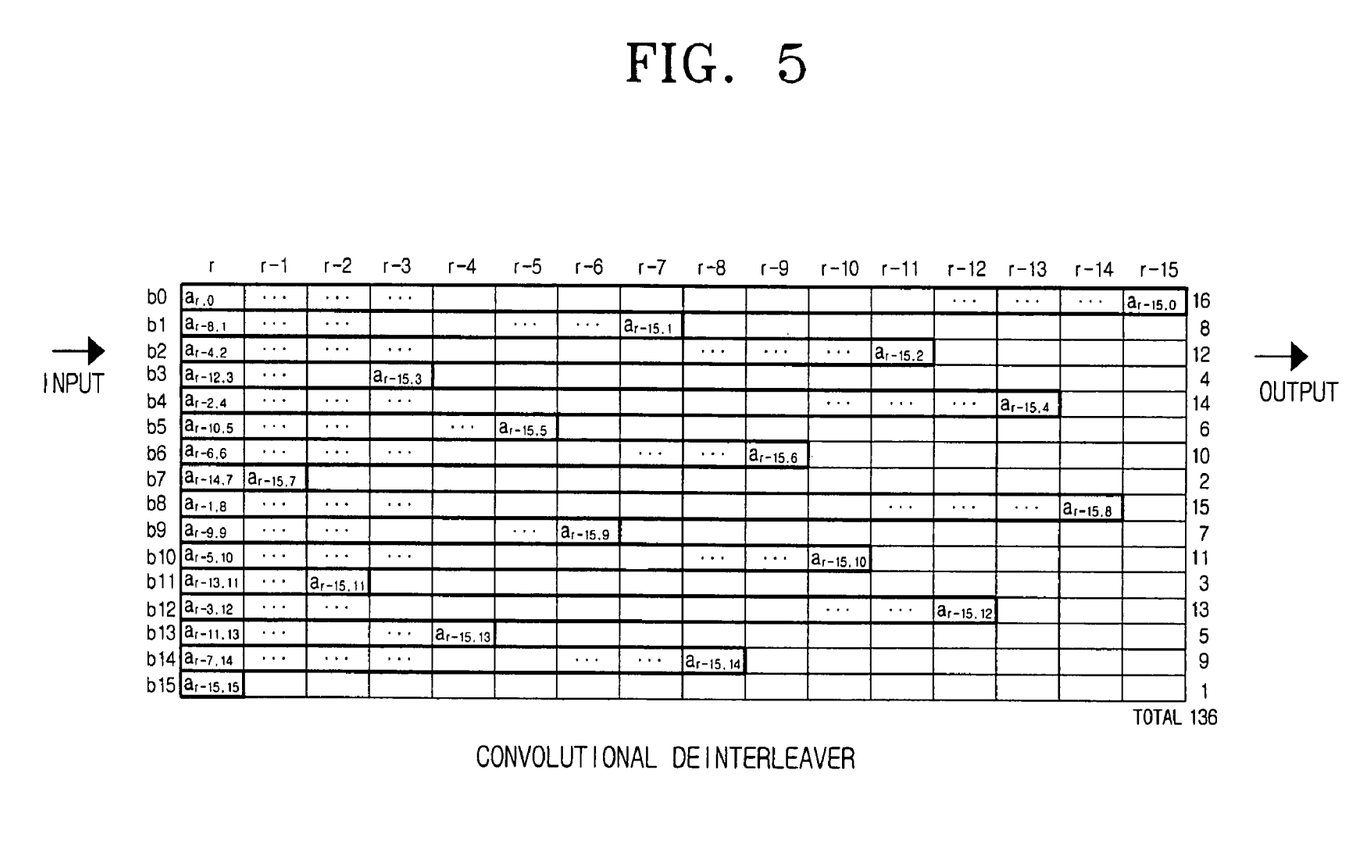
FIG. 5 is a view for showing a shift register configuration of a convolutional deinterleaver according to an embodiment of the present invention.

FIG. 5 is a view for showing a convolutional deinterleaver structure corresponding to the convolutional deinterleaver of the transmitter (refer to FIG. 2B). As shown in FIG. 5, the convolutional deinterleaver performs the deinterleaving over every modulo-16 corresponding to the convolutional deinterleaver of the transmitter (refer to FIG. 2B). That is, the convolutional deinterleaver has a structure having 16 branches b0, b1, . . . , b15 and each branch has 16 registers at maximum.

That is, the branch b0 has 16 registers, and the branch b1 has 8 registers, and, as shown in FIG. 2B, the convolutional deinterleaver consists of 136 registers in total in the unit of modulo-16.

The symbols inputted to each of the 16 branches b0 to b15 of the convolutional deinterleaver at time r correspond to ones outputted from the convolutional deinterleaver shown in FIG. 2B at time r, and the symbols are $a_{r,0}$, $a_{r-8,1}$, $a_{r-4,2}$, $a_{r-12,3}$, . . . , $a_{r-15,15}$. Therefore, the 16 branches of the convolutional deinterleaver input the symbols $a_{r,0}$, $a_{r-8,1}$, $a_{r-4,2}$, $a_{r-12,3}$, . . . , $a_{r-15,15}$ at the time r, respectively, so the 16 branches output the symbols $a_{r-15,0}$, $a_{r-15,1}$, $a_{r-15,2}$, $a_{r-15,3}$, . . . , $a_{r-15,15}$, respectively. That is, the branch b0 outputs the delayed symbol $a_{r-15,0}$ inputted ahead of 16 symbols with respect to the symbol $a_{r,0}$ inputted by the 16 registers, the branch b1 outputs the delayed symbol $a_{r-16,1}$ inputted ahead of 8 symbols with respect to the symbol $a_{r-7,1}$ inputted ahead of the 8 symbols, and, in the same manner, the branch b15 outputs the delayed symbol $a_{r-15,5}$ inputted ahead of one symbol by one register.

As above, the deinterleaving can be performed over the 16 CIFs by use of the 3456 convolutional deinterleavers each having the 16 branches and the maximum depth of 16. However, in case of implementing the deinterleaver by use of the above registers, there exists a drawback that the chip becomes large in size upon its manufacturing. Therefore, the memory can be implemented by utilizing the convolutional deinterleaver structure.

Figure 6A:
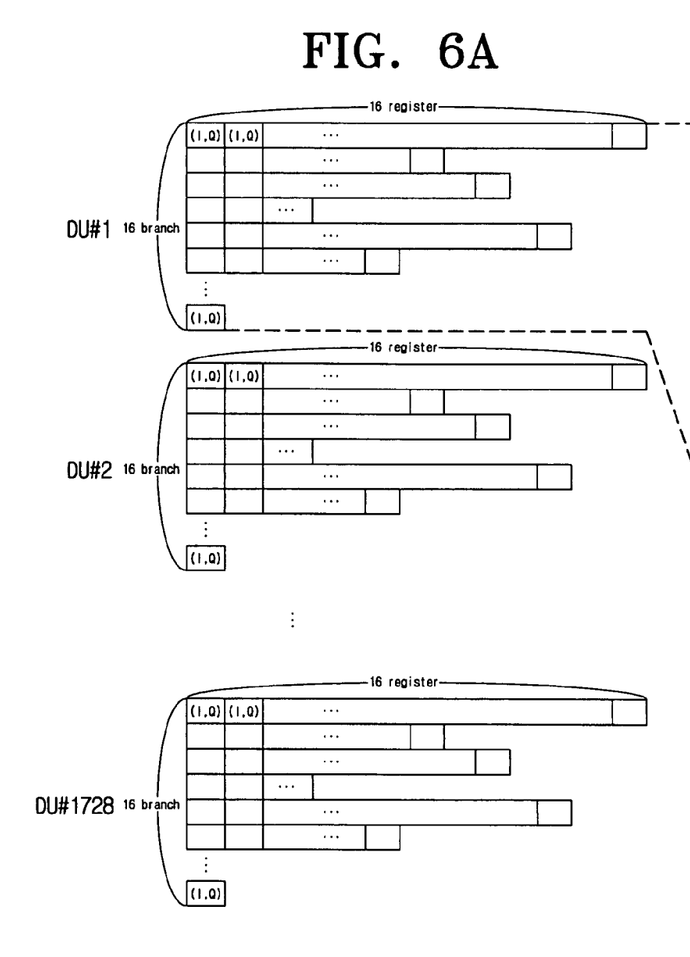
FIG. 6A and FIG. 6B are views for showing a structure of a deinterleaver memory according to an embodiment of the present invention.
Figure 6B:
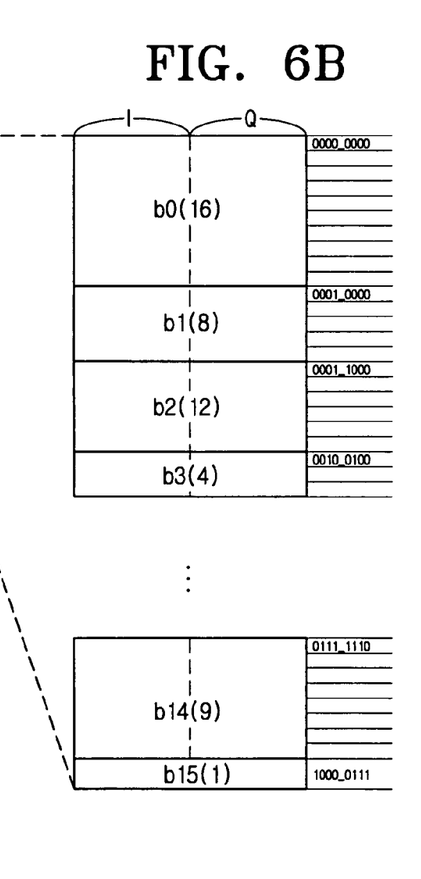

FIGS. 6A and 6B are views for showing a structure of the deinterleaver memory 310 according to the present invention based on the convolutional deinterleaver structure shown in FIG. 5, which will be described in detail with reference to FIGS. 6A and 6B.

As shown in FIG. 6A, the deinterleaving unit (DU) refers to the deinterleaving by one convolutional deinterleaver consisting of a register having 16 branches and a maximum depth of 16. When considering that data is inputted in (I,Q) pairs, the memory size of 8 bits×(16/16)×136 is required to process one deinterleaving unit (DU). Here, one deinterleaving unit (DU) is obtained from the deinterleaving over a group of 16 data which consists of 16 18-bit data.

According to the present invention, when a CIF is a data group having 55296 4-bit data, the memory size of about 2 Mbits, 4 bits×(55296/16)×136, is required for the deinterleaving over 16 CIFs. Here, if the data is inputted in (I,Q) pairs, the width of the deinterleaver memory becomes 8 bits, and the entire memory addresses becomes 2 Mbits, 1728×136.

FIG. 6B shows in detail a memory structure for one deinterleaving unit (DU). As shown in FIG. 6B, the memory has 8 bits in width, and has 136 addresses corresponding to the number of registers of the convolutional deinterleaver shown in FIG. 5, and the 136 addresses are divided into the predetermined number of groups of register addresses for the 16 branches.

That is, the memory space corresponding to the branch b0 has 16 register addresses from 0000_0000 to 0000_1111, the memory space corresponding to the branch b1 has 8 register addresses from 0001_0000 to 0001_0111, and, in the above manner, the memory space corresponding to the branch b15 has one register address, 1000_0111.

Therefore, the memory addresses generated from the address generator 320 with respect to (I,Q) pair data which is input data can be expressed in Equation 1 as follows:

[Equation 1]

Memory addresses=(136×N)+start address of each-branch+register address, where, N denotes 0, 1, 2, . . . , 1727, and (136×N) denotes a deinterleaving unit (DU).

Corresponding start addresses are selected for memory addresses, and the number of relative register addresses for each branch is gradually increased. If the number of register addresses is increased as many as the number of relative register addresses for each branch, the register address for each branch turns back to the start address of a branch. Each branch has a start address, and the sum of the start address of each branch and the register addresses form read and write addresses in each deinterleaving unit (DU).

The (136×N) in Equation 1 denotes the writing of 1728 (I,Q) pair data by increasing addresses by 136 after the 16 (I,Q) pair data is completely written.

For example, 16 data of the first deinterleaving unit (DU#1) are written at the start addresses of respective branches (0000_0000), (0001_0000), (0001_1000), . . . , (1000_0111), and then 16 data of the second deinterleaving unit (DU#2) are written at memory addresses resulting from adding 136 (1000_1000) to the memory addresses at which the 16 data are written, that is, (1000_1000), (1001_1000), (1001_1000), (1010_0000), . . . , (0001_0000_1111).

When comparing the memory structure of FIG. 6B to the convolutional deinterleaver structure shown in FIG. 5, for example, if data written at the start addresses of the respective branches are read out in order to write 16 data inputted at time r at the start addresses of the respective branches, the data $a_{r-16,0}$ at time r-16 which is written at the start address (0000_0000) of the branch b0 is read to write the input data at the start address (0000_0000). Therefore, the deinterleaving is performed by reading and writing data written in the memory in the convolutional deinterleaving manner.

Thus, the memory of the convolutional deinterleaving structure according to the present invention reduces its size to 2 Mbits which is 50% off the size 4 Mbits of the deinterleaver memory for the conventional European DAB receiver. As above, the present invention can reduce the physical memory size but also power consumption.

Figure 7:
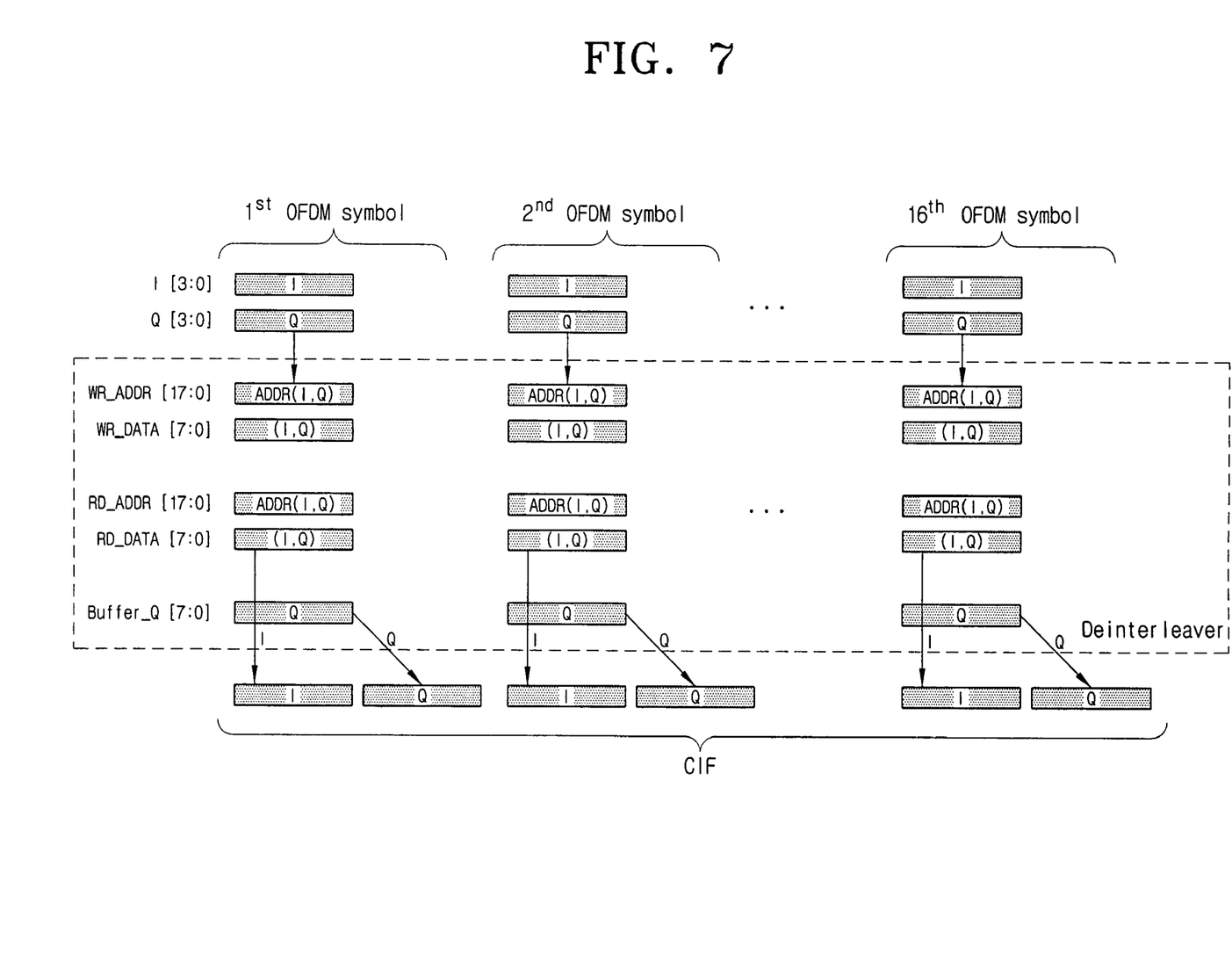
FIG. 7 is a flow chart for showing input/output data flowing in and out of the deinterleaver according to an embodiment of the present invention.

FIG. 7 is a view for showing flows of input/output data of the deinterleaver according to the present invention.

Figure 8:
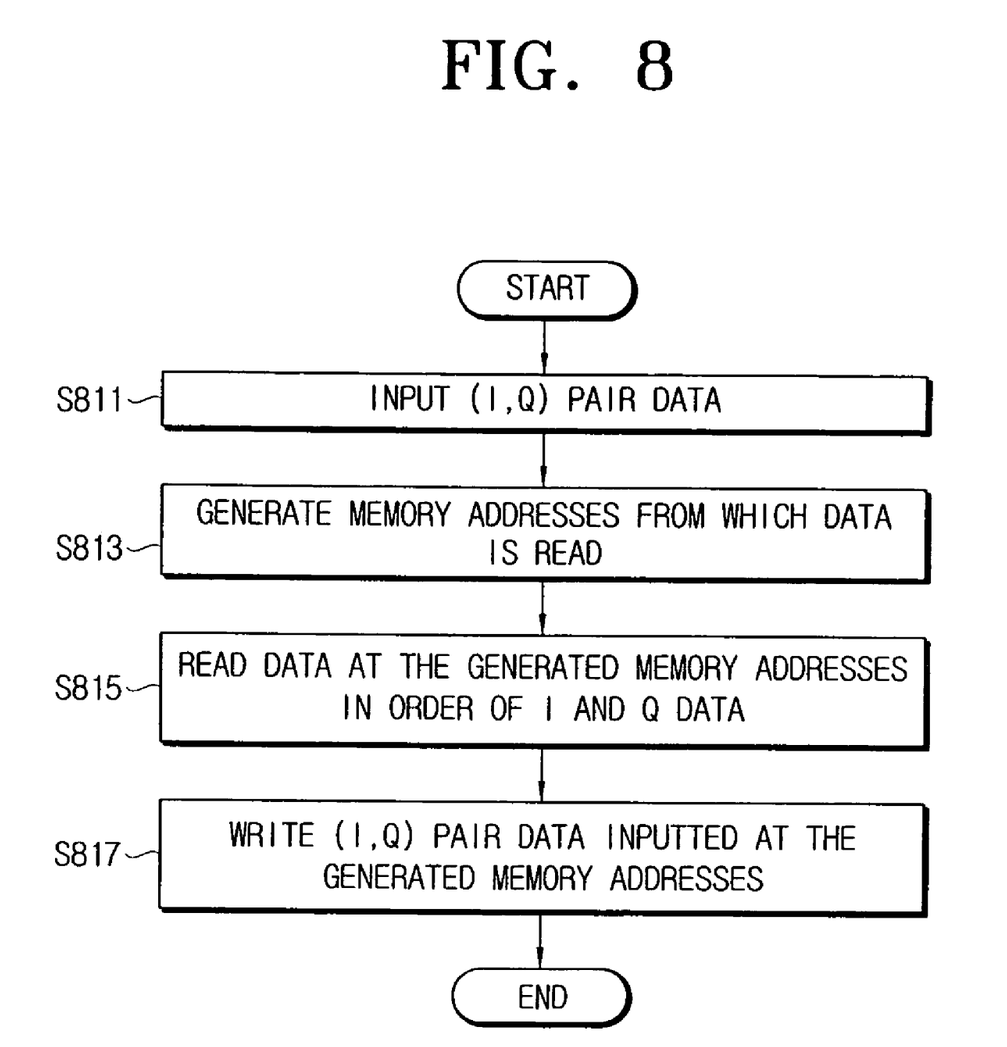
FIG. 8 is a flow chart for showing a deinterleaving process according to an embodiment of the present invention.

The deinterleaver inputs I data and Q data in pairs that are decoded with 4-bit soft decision, as shown in FIG. 7 and FIG. 8 (S811).

The controller 360 controls the address generator 320 to generate a memory address so that the (I,Q) pair data is written in the memory 310. That is, the controller 360 decides the memory address at which data to be deinterleaved in the memory 310 is written according to the characteristics of a structure of the memory 310, and controls the address generator 320 to generate the decided memory address (S813).

The read-enable unit 330 reads data written at a corresponding address based on the memory address generated from the address generator 320 (S815).

Here, the controller 360 writes the read data, that is, Q data of the (I,Q) pair data in the buffer 350, and first outputs the I data. Next, if the I data is completely outputted, the controller 360 outputs the Q data. Therefore, as shown in FIG. 7, the (I,Q) pair data is written, deinterleaved, and outputted in order of the I data and Q data.

The controller 360 controls the write-enable unit 340 to write the data at the memory address of the data read from the memory 310 by the read-enable unit 330, that is, at the memory address generated from the address generator 320 (S817).

That is, the deinterleaving process according to the present invention generates a certain memory address to write input data, reads corresponding data, and writes the input data at a certain memory address. Thus, the process reads memory data, and then writes input data.

Further, the present invention buffers Q data with respect to the deinterleaved (I,Q) pair data outputted and outputs the Q data if the I data is completely outputted, to thereby output the deinterleaved data in order of the I data and Q data.

Accordingly, the present invention can downsize the deinterleaver memory in half, having the same performance as prior art.

The present invention can buffer Q data of a DQPSK signal demodulated in the unit of OFDM symbols, perform the deinterleaving by use of the memory of about 2 Mbits through an address control circuit, and have the same performance as the deinterleaver using the existing memory of 4 Mbits. Further, the present invention can reduce power consumption due to the downsized memory.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A deinterleaving device for digital broadcast receivers for performing deinterleaving over K groups of input data wherein K is an integer, the deinterleaving device comprising:
   a memory having storage space for a specified number of deinterleaving units for performing the deinterleaving in the specified number of deinterleaving units over the K groups of input data;
   an address generator which generates addresses for reading existing data written in the memory at the generated addresses and for writing the input data to the same generated addresses;
   a read-enable unit for reading existing data written at the generated memory addresses;
   a write-enable unit for writing the input data at the same generated memory addresses; and
   a controller for controlling the address generator to generate the memory addresses for the input data in correspondence with the deinterleaving units, the controller controlling the read-enable unit and the write-enable unit to read existing data written at the memory addresses before writing the input data at the memory addresses.

2. The deinterleaving device as claimed in claim 1, wherein the input data and the existing data consist of pairs of first data and second data.

3. The deinterleaving device as claimed in claim 1, further comprising a buffer for temporarily storing specific data of the data read by the read-enable unit, wherein the controller controls the buffer to first output data except for the specific data of the read data and then output the specific data temporarily stored in the buffer.

4. The deinterleaving device as claimed in claim 1, wherein the deinterleaving units are the units over which the deinterleaving is performed by a convolutional deinterleaver having branches and K registers at maximum for each branch, memory space capable of storing K (K+1)/2 for the deinterleaving, and the memory has the memory space corresponding to the specified number of deinterleaving units.

5. The deinterleaving device as claimed in claim 4, wherein the memory addresses each comprise a branch start address and a register address in a deinterleaving unit, and, corresponding to the specified number of deinterleaving units, K input data in a first deinterleaving unit are written at memory addresses resulting from adding K ((K+1)/2 to each of memory addresses at which K input data in a second deinterleaving unit are written.

6. The deinterleaving device as claimed in claim 1, wherein the K is 16, each of the groups is a Common Interleaved Frame (CIF), and the CIF consists of 55296 data decoded with 4-bit soft decision.

7. The deinterleaving device as claimed in claim 1, wherein the specified number of deinterleaving units is 1728 deinterleaving units based on data input in pairs.

8. The deinterleaving device of claim 1, wherein the deinterleaving device deinterleaves the data in correspondence with an interleaving unit at a transmitter.

9. A deinterleaving method which reduces a required size of memory in digital broadcast receivers which perform deinterleaving over K groups of input data wherein K is an integer, the method comprising:
   generating memory addresses for writing input data in a memory having storage space for performing the deinterleaving in a specified number of deinterleaving units over the K groups of the input data;
   reading existing data written at the generated memory addresses; and
   writing the input data at the same generated memory addresses,
   wherein the writing input data at the same generated memory addresses as the existing data was read from reduces the required memory size.

10. The deinterleaving method as claimed in claim 9, wherein the input data and the existing data consist of pairs of first data and second data.

11. The deinterleaving method as claimed in claim 9, wherein the reading the existing data includes:
   temporarily storing specific data of the data read from the memory; and
   outputting the specific data after outputting data except for the specific data of the read data.

12. The deinterleaving method as claimed in claim 9, wherein a deinterleaving unit is a unit over which the deinterleaving is performed by a convolutional deinterleaver having branches and K registers at maximum for each branch, memory space capable of storing K ((K+1)/2 for the deinterleaving, and the memory has the memory space corresponding to the specified number of deinterleaving units.

13. The deinterleaving method as claimed in claim 12, wherein the memory addresses each comprise a branch start address and a register address corresponding to a deinterleaving unit, and, corresponding to the specified number of deinterleaving units, K input data in a first deinterleaving unit are written at memory addresses resulting from adding K (K+1)/2 to each of memory addresses at which K input data in a second deinterleaving unit are written.

14. The deinterleaving method as claimed in claim 9, wherein the K is 16, each of the groups is a Common Interleaved Frame (CIF), and the CIF consists of 55296 data decoded with 4-bit soft decision.

15. The deinterleaving method as claimed in claim 9, wherein the specified number of deinterleaving units is 1728 deinterleaving units based on data input in pairs.

16. The deinterleaving method of claim 9, wherein the deinterleaving is performed in correspondence with an interleaving unit at a transmitter.

* * * * *